(12) United States Patent
Jaksic et al.

(10) Patent No.: US 10,937,747 B2
(45) Date of Patent: Mar. 2, 2021

(54) POWER INVERTER MODULE WITH REDUCED INDUCTANCE

(71) Applicant: GM GLOBAL TECHNOLOGY OPERATIONS LLC, Detroit, MI (US)

(72) Inventors: Marko Jaksic, Shelby Township, MI (US); Ajay V. Patwardhan, Novi, MI (US); Constantin Stancu, Torrance, CA (US); John Czubay, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 16/516,607

(22) Filed: Jul. 19, 2019

(65) Prior Publication Data

US 2021/0020588 A1 Jan. 21, 2021

(51) Int. Cl.
*H01L 23/50* (2006.01)
*H01L 23/64* (2006.01)
(Continued)

(52) U.S. Cl.
CPC ........ *H01L 23/645* (2013.01); *H01L 23/3735* (2013.01); *H01L 23/4985* (2013.01); *H01L 23/49811* (2013.01); *H01L 23/50* (2013.01); *H01L 23/528* (2013.01); *H01L 24/32* (2013.01); *H01L 24/40* (2013.01); *H01L 24/48* (2013.01);
(Continued)

(58) Field of Classification Search
CPC ............... H01L 23/645; H01L 23/3735; H01L 23/49811; H01L 23/4985; H01L 23/50; H01L 23/528; H01L 24/32; H01L 24/40; H01L 24/48; H01L 25/072; H01L 25/07; H01L 25/117; H01L 25/50; H01L 25/073; H01L 2224/27505; H01L 2224/32151; H01L 2224/48472; H01L 2924/13055; H01L 2924/13091; H01L 2924/19042; H01L 2924/19043; H01L 2924/30107; H02M 7/003; H02M 7/537; H02M 7/5387; H02M 7/06; H02M 7/48
See application file for complete search history.

(56) References Cited

U.S. PATENT DOCUMENTS

5,492,842 A * 2/1996 Eytcheson ............ H02M 7/003
29/593
9,917,065 B1 3/2018 Ward et al.
(Continued)

*Primary Examiner* — Nikolay K Yushin
(74) *Attorney, Agent, or Firm* — Quinn IP Law (57) ABSTRACT

A power inverter module includes a base module having a plurality of electrically conductive layers, including a first conductive layer, a second conductive layer and a third conductive layer. A first terminal is operatively connected to the first conductive layer at a first end and a second terminal is operatively connected to the second conductive layer at the first end. An isolation sheet is sandwiched between the first and second terminals. The first terminal and the second terminal include a respective proximal portion composed of a first material and a respective distal portion composed of a second material. At least one of the first terminal and the second terminal is bent to create an overlap zone such that a gap between the first terminal and the second terminal in the overlap zone is less than a threshold distance. The power inverter module is configured to reduce parasitic inductance.

19 Claims, 5 Drawing Sheets

(51) Int. Cl.
  *H01L 23/498*  (2006.01)
  *H01L 23/528*  (2006.01)
  *H01L 25/07*   (2006.01)
  *H02M 7/00*    (2006.01)
  *H01L 23/00*   (2006.01)
  *H01L 23/373*  (2006.01)

(52) U.S. Cl.
  CPC .......... *H01L 25/072* (2013.01); *H02M 7/003* (2013.01); *H01L 2224/27505* (2013.01); *H01L 2224/32151* (2013.01); *H01L 2224/48472* (2013.01); *H01L 2924/13055* (2013.01); *H01L 2924/13091* (2013.01); *H01L 2924/19042* (2013.01); *H01L 2924/19043* (2013.01); *H01L 2924/30107* (2013.01)

(56) References Cited

U.S. PATENT DOCUMENTS

| | | |
|---|---|---|
| 10,283,475 B2 | 5/2019 | Ward et al. |
| 2008/0303056 A1 | 12/2008 | Ward et al. |
| 2013/0049204 A1 | 2/2013 | Oeschler et al. |
| 2013/0147540 A1 | 6/2013 | Wu et al. |
| 2016/0093594 A1 | 3/2016 | Funatsu et al. |

\* cited by examiner

POWER INVERTER MODULE WITH REDUCED INDUCTANCE

STATEMENT REGARDING FEDERALLY-SPONSORED RESEARCH OR DEVELOPMENT

This invention was made with Government support under Agreement No. DE-EE-0007285, awarded by the U. S. Department of Energy. The United States Government may have certain rights in this invention.

INTRODUCTION

The present disclosure relates to a power inverter module having a configuration with reduced inductance and corresponding method. The use of purely electric vehicles and hybrid vehicles has greatly increased over the last few years. By employing a high-voltage electric traction motor as a propulsion source, many vehicles may operate in one or more electric vehicle modes. For example, a battery electric vehicle may operate exclusively in an electric vehicle mode, while a hybrid electric vehicle may selectively employ one or both of an internal combustion engine and a traction motor during different operating modes.

The traction motors used for propelling the vehicle in an electric vehicle mode are generally configured as multiphase AC induction or permanent magnet machines. However, the battery source from which the traction motor draws electrical power from is a high-voltage DC storage device. Thus, AC-to-DC and DC-to-AC power conversion is needed. A power inverter module may be employed to convert the DC current from the battery source of the electric or hybrid vehicle to AC current to be used in the electric motor to drive the propulsion system of the vehicle. The power inverter module may include various semiconductor switches to achieve the required power conversion. It is a challenging task to provide high power density, meet packaging requirements while reducing parasitic inductance in the power inverter module.

SUMMARY

Disclosed herein is a power inverter module and corresponding method of forming the power inverter module. The power inverter module includes a base module having a plurality of electrically conductive layers, including a first conductive layer, a second conductive layer and a third conductive layer. The base module defines a first end and a second end. A first terminal is operatively connected to the first conductive layer at a first end and a second terminal is operatively connected to the second conductive layer at the first end. An isolation sheet is sandwiched between the first terminal and the second terminal.

The power inverter module is configured to support high switching frequency operation and to provide high power density with low parasitic inductance. The first terminal and the second terminal include a respective proximal portion composed of a first material and a respective distal portion composed of a second material. At least one of the first terminal and the second terminal is bent to create an overlap zone such that a gap between the first terminal and the second terminal in the overlap zone is less than a threshold distance. In one example, the threshold distance is 1 mm.

The first conductive layer and the second conduction may be at least partially composed of the first material. The first terminal may be laser-welded to the first conductive layer at the respective proximal portion and the second terminal may be laser-welded to the second conductive layer at the respective proximal portion. A first insulation layer is positioned between and configured to electrically isolate the first conductive layer and the second conductive layer. A second insulation layer is positioned between and configured to electrically isolate the second conductive layer and the third conductive layer. The first conductive layer, the second conductive layer and the third conductive layer may be composed of at least one of aluminum and copper. The first insulation layer and the second insulation layer may be composed of at least one of silicon nitride, aluminum nitride and aluminum oxide.

The power inverter module includes one or more output nodes at the second end. The output nodes have a respective first portion composed of the first material and a respective second portion composed of the second material. The first conductive layer is composed of the first material. The output nodes may be laser-welded to the first conductive layer at the respective first portion. The respective first portion of the output nodes may include a respective plurality of fingers separated by respective gaps.

The first conductive layer may be divided into a plurality of spaced-apart islands, including a first set of islands and a second set of islands. The first set of islands extends between a center axis and the first end and the second set of islands extends between the center axis and the second end. A respective first plurality of semiconductor devices may be positioned on each of the first set of islands. A respective first connector may be sintered to the respective first plurality of semiconductor devices and configured to connect the respective first plurality of semiconductor devices to the second set of islands. A respective second plurality of semiconductor devices may be positioned on each of the second set of islands. A respective second connector may be sintered to the respective second plurality of semiconductor devices and configured to connect the respective second plurality of semiconductor devices to the second conductive layer.

A respective flexible circuit may be positioned on each of the plurality of spaced-apart islands. A plurality of gate resistors may be mounted on the respective flexible circuit. A plurality of semiconductor devices may be mounted on each of the plurality of spaced-apart islands. The respective flexible circuit may include a first plurality of contact pads configured to respectively connect the plurality of gate resistors to a respective gate layer of the respective flexible circuit. The respective flexible circuit may include a second plurality of contact pads configured to connect the plurality of semiconductor devices.

Each of the first set of islands may define a respective cutout portion surrounding two respective conducting sections. A respective thermistor may be positioned in the respective cutout portion. The respective flexible circuit includes a third plurality of contact pads configured to connect the respective thermistor to a conductive track in the respective flexible circuit, via the two respective conducting sections.

The power inverter module may include a housing assembly having a lid, a first frame and a second frame. The lid is configured to at least partially cover a surface defined by the plurality of spaced-apart islands of the first conductive layer. The first frame and second frame are configured to encapsulate respective peripheral regions of the first conductive layer, the second conductive layer and the third conductive layer. The first frame and second frame may be composed of a polymer-based or plastic material. The second frame may be nested in the first frame. The first frame includes a central opening and a plurality of slots located circumferentially relative to the central opening. Additionally, the second frame includes respective apertures configured to fit to the plurality of islands and respective side pockets configured to fit the one or more output nodes. The second frame includes a first terminal slot configured to fit the first terminal and the first frame includes a second terminal slot configured to fit the second terminal. The lid includes respective through holes configured to fit the respective flexible circuit.

The above features and advantages and other features and advantages of the present disclosure are readily apparent from the following detailed description of the best modes for carrying out the disclosure when taken in connection with the accompanying drawings.

DETAILED DESCRIPTION

Figure 1:
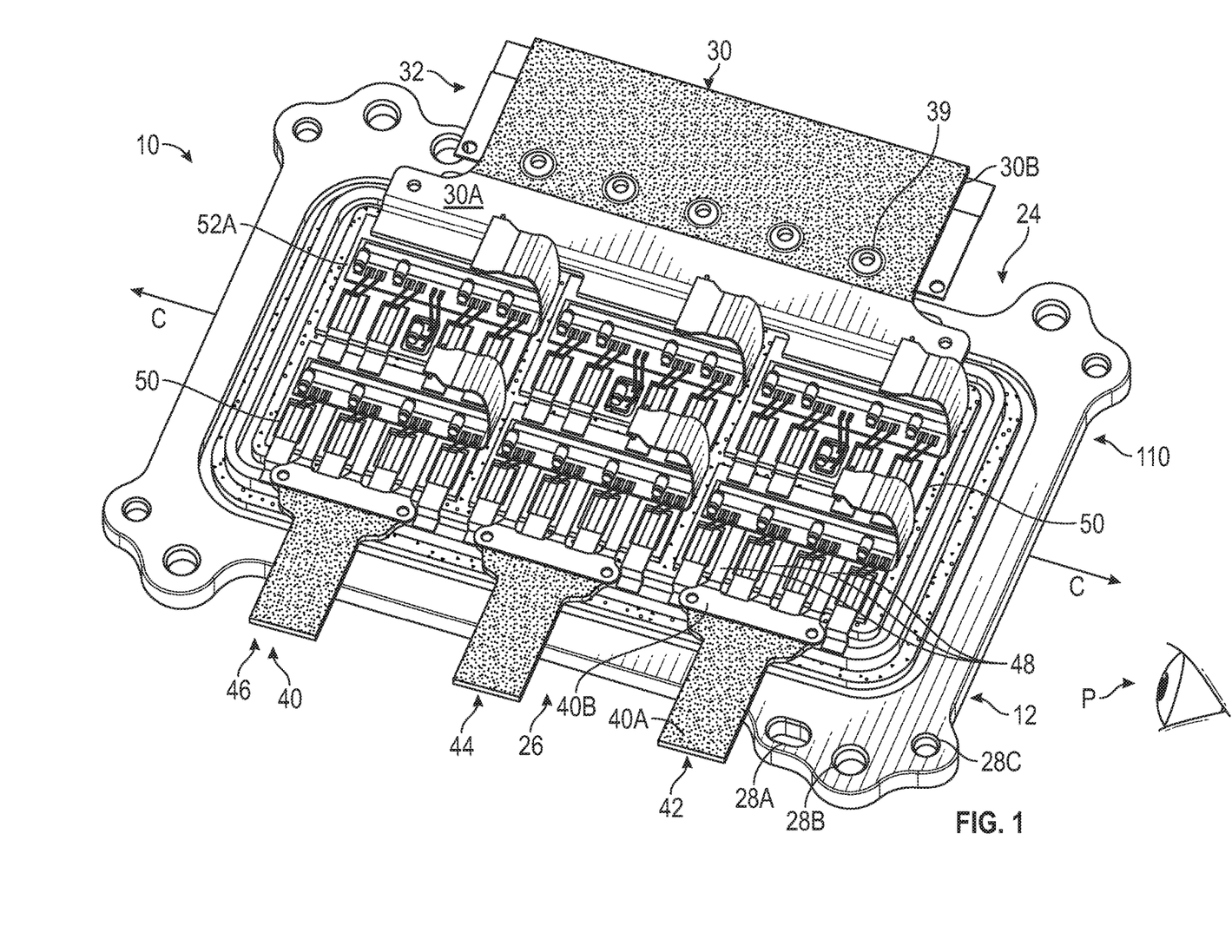
FIG. 1 is a schematic perspective view of a power inverter module having a first conductive layer with a plurality of spaced-apart islands.

Referring to the drawings, wherein like reference numbers refer to like components, FIG. 1 schematically illustrates a power inverter module 10. The power inverter module 10 may be employed for use in a mobile platform, such as, but not limited to, a passenger car, sport utility vehicle, light truck, heavy duty vehicle, ATV, minivan, bus, transit vehicle, bicycle, robot, farm implement (e.g. tractor), sports-related equipment (e.g. golf cart), boat, plane and train. The mobile platform may take many different forms and include multiple and/or alternate components and facilities. The power inverter module 10 has a configuration enabling significantly reduced inductance, and allowing fast switching control of semiconductor devices such as wideband gap devices.

Figure 2:
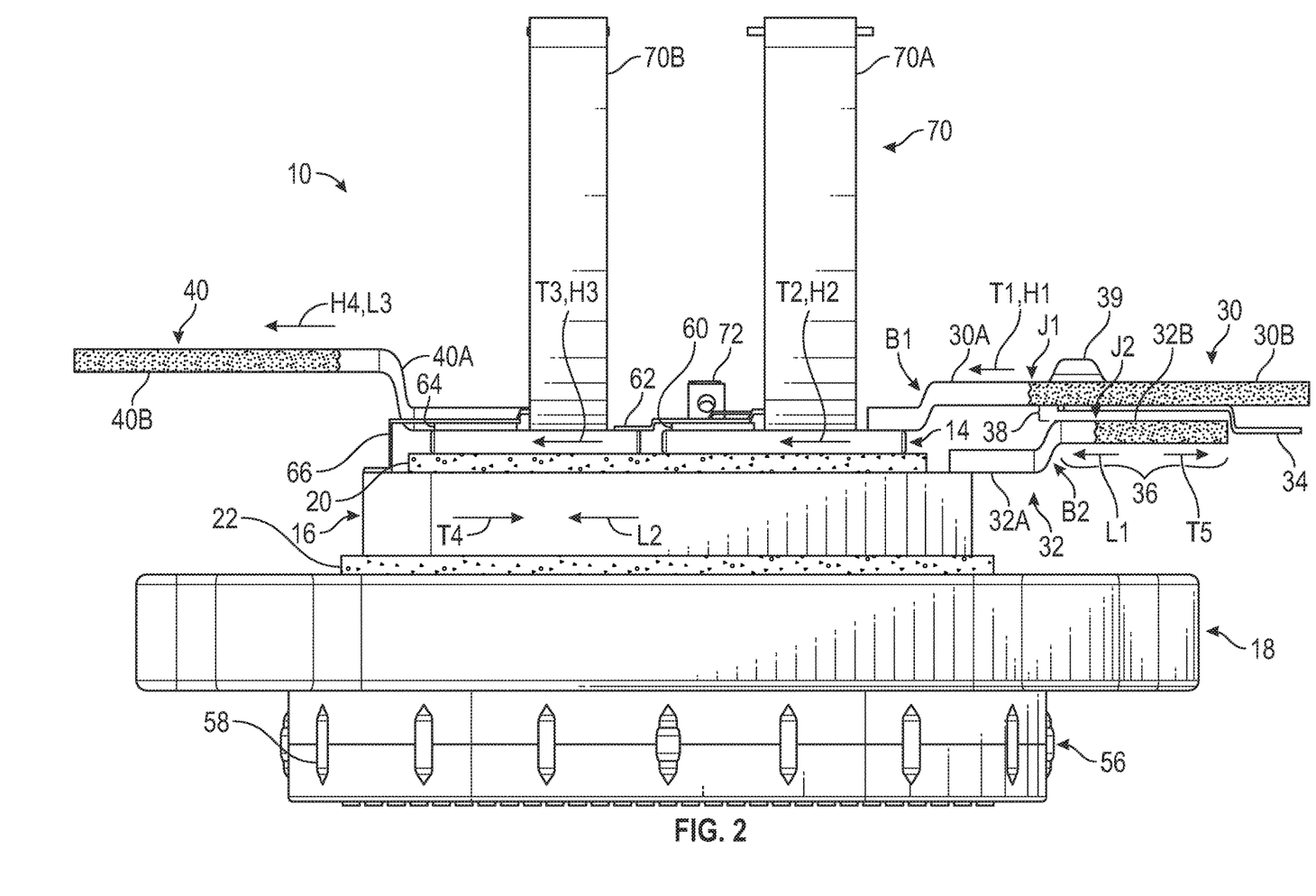
FIG. 2 is a schematic end view of the power inverter module of FIG. 1.
Figure 3:
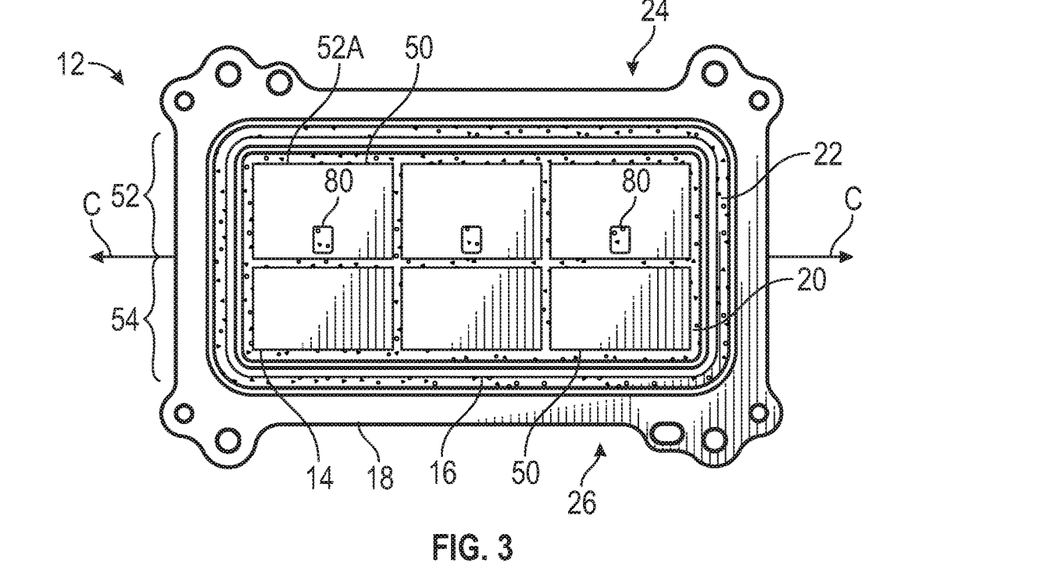
FIG. 3 is a schematic plan view of the power inverter module of FIG. 1, with components removed to show the plurality of spaced-apart islands in the first conductive layer.

FIG. 2 is a schematic end view of the power inverter module 10, viewed from position P in FIG. 1. It is to be understood that the figures are not drawn to scale. Referring to FIGS. 1-2, the power inverter module 10 includes a base module 12 having a plurality of electrically conductive layers, including a first conductive layer 14, a second conductive layer 16 and a third conductive layer 18. FIG. 3 is a schematic plan view of the base module 12, with many components removed for illustration purposes.

Referring to FIGS. 1-3, a first insulation layer 20 is positioned between and configured to electrically isolate the first conductive layer 14 and the second conductive layer 16. A second insulation layer 22 is positioned between and configured to electrically isolate the second conductive layer 16 and the third conductive layer 18. The first conductive layer 14, the second conductive layer 16 and the third conductive layer 18 may each be composed of a conductor of electricity, such as but not limited to, aluminum, copper, steel and various combinations of alloys. The first insulation layer 20 and second insulation layer 22 may each be composed of an electrical insulator, including but not limited to, aluminum nitride, aluminum oxide or silicon nitride. The insulation material is shown with light shading in FIGS. 1-3.

Referring to FIGS. 1 and 3, the base module 12 defines a first end 24, a second end 26 and a center axis C (imaginary) between the first end 24 and the second end 26. Referring to FIGS. 1-3, the power inverter module 10 includes a first terminal 42 (positive in this embodiment) operatively connected to the first conductive layer 14 at the first end 24. A second terminal 32 (negative in this embodiment) is operatively connected to the second conductive layer 16 at the first end 24. The first terminal 30 is of opposite polarity relative to the second terminal 32. An isolation sheet 34, such as for example, relatively thin insulation paper, is sandwiched between the first terminal 30 and the second terminal 32. Referring to FIGS. 1-2, the first terminal 30 may be secured to the isolation sheet 34 with non-conductive fasteners 39. The first terminal 30 and second terminal 32 are positioned at the first end 24 of the power inverter module 10 to enable easy integration with the rest of the system.

Referring to FIG. 2, at least one of the first terminal 30 and the second terminal 32 is bent to create an overlap zone 36 such that a gap 38 between the first terminal 30 and the second terminal 32 in the overlap zone 36 is less than a threshold distance. In other words, the relative distance between the first terminal 30 and the second terminal 32 is varied such that the first terminal 30 at least partially grazes the second terminal 32 at the overlap zone 36. This configuration reduces parasitic inductance of the first terminal 30 and second terminal 32. In one example, the threshold distance is 1 mm. It is understood that the threshold distance may vary based on the application at hand and manufacturing process employed. As noted above, the figures are not drawn to scale. In the example shown, both the first terminal 30 and the second terminal 32 are bent. Referring to FIG. 2, the first terminal 30 is bent at section B1 and the second terminal 32 is bent at section B2.

In the example shown in FIG. 1, input DC power is delivered through the first end 24 and output AC power is delivered through the second end 26. The power inverter module 10 includes one or more output nodes 40 ("one or more" omitted henceforth) at the second end, such as first output node 42, second output node 44 and third output node 46 (see FIG. 1), for transferring the output AC power. For ease of assembly and integration, referring to FIG. 1, the respective first portion 40A of the output nodes 40 may include a respective plurality of fingers 48 (shown also in FIG. 5) separated by respective gaps. Referring to FIG. 2, a heat sink 56 may be positioned adjacent to the third conductive layer 18 and configured to dissipate heat, via cooling fins 58.

Referring to FIGS. 1-2, the first terminal 30 includes a respective proximal portion 30A composed of a first material, separated at a joint J1 by a respective distal portion 30B composed of a second material. In FIGS. 1-5, the second material is illustrated with stippling or dense shading. The second terminal 32 includes a respective proximal portion 32A composed of the first material, separated at a joint J2 by a respective distal portion 32B composed of the second material. In a non-limiting example, the first material is aluminum and the second material is copper. Similarly, the output nodes 40 may include a respective first portion 40A composed of the first material and a respective second portion 40B composed of the second material. In the embodiment shown, the joints J1 and J2 include dovetail-shaped interlocking features for rigidity and stability.

In one example, the respective proximal portion 30A and the respective distal portion 30B are extruded through a die (not shown) and passed through a pair of rollers under sufficient deforming pressure to create the joint J1. Heat may be applied. A cladding process for bonding together dissimilar metals, such as laser cladding, and/or other techniques available to those skilled in the art may be employed to form the first terminal 30, second terminal 32 and output nodes 40.

The first conductive layer 14 and the second conductive layer 16 may be at least partially composed of the first material. This configuration enables laser-welding of the first terminal 30 and the output nodes 40 to the first conductive layer 14 (and second terminal 32 to the second conductive layer 16) of the base module 12, reducing parasitic inductance and parasitic resistance. Referring to FIG. 2, the first terminal 30 may be laser-welded to the first conductive layer 14 at the respective proximal portion 30A and the second terminal is may be laser-welded to the second conductive layer at the respective proximal portion. The output nodes 40 may be laser-welded to the first conductive layer at the respective first portion 40A.

Referring now to FIG. 3, the first conductive layer 14 may be etched and divided into a plurality of spaced-apart islands 50, including a first set of islands 52 and a second set of islands 54. The first set of islands 52 extend between the center axis C and the first end 24, while the second set of islands 54 extend between the center axis C and the second end 26. In the example shown, there are three islands in each of the first set of islands 52 and second set of islands 54. However it is understood that the number of islands may be varied based on the application at hand.

A respective first plurality of semiconductor devices 60 (shown in FIG. 2) is positioned on each of the first set of islands 52, via a respective first connector 62 (shown in FIG. 2) that may be sintered onto the respective first plurality of semiconductor devices 60. Similarly, a respective second plurality of semiconductor devices 64 (shown in FIG. 2) is positioned on each of the second set of islands 54, via a respective second connector 66 (shown in FIG. 2) that may be sintered onto the respective second plurality of semiconductor devices 64. The respective second connector (e.g. copper strap) is used to connect the second plurality of semiconductor devices 64 to the second conductive layer 16, which may also be etched.

The respective first and second plurality of semiconductor devices 60, 64 function as a voltage-controlled bipolar switching device and may include an insulated gate bipolar transistor (IGBT), a metal-oxide semiconductor field effect transistor (MOSFET), wideband gap device (WBG), Vertical Junction Field Effect Transistors (VJFET) or other suitable switch having a corresponding gate to which a gate signal is applied to change the on/off state of a given switch. Generally at least two semiconductor devices are employed for each phase of a three-phase electric machine. The semiconductor devices are independently responsive to signals from a control board or controller (not shown) to govern the electrical output of the power inverter module 10. Referring to FIG. 2, the output nodes 40 may be interleaved between the respective second plurality of semiconductor devices 64, improving thermal capability of the power inverter module 10 and allowing equal current sharing among the semiconductor devices.

The first connector 62 and the second connector 66 may be composed of a conductor of electricity, including but not limited to, aluminum, copper, steel and various combinations of alloys, and may be in the form of wires, ribbons or straps. In addition to electrical connectivity, the first connector 62 and the second connector 66 provide a path to extract heat out of the respective first and second plurality of semiconductor devices 60, 64, thereby improving the overall thermal performance of the power inverter module 10.

Referring to FIG. 2, the respective first connector 62 and the respective second connector 66 may be simultaneously sintered to the respective first and second plurality of semiconductor devices 60, 64. The sintering process may include urging micro particles of a predefined conductor (e.g. copper, silver) to coalesce into a solid form via heating at a predetermined temperature for a predetermined time. In a non-limiting example, the predetermined temperature is in a range between about 225 Celsius and 275 Celsius and the predetermined time is in a range of 3 to 7 minutes. The sintering process may include compressing the micro particles of the predefined conductor between two layers at a predefined pressure, such as for example, 10-20 MPa. The sintering process may be carried out in a vacuum to avoid undesirable reactions with air/oxygen. The sintering process makes the powdery micro particles coalesce or diffuse into a solid or porous mass by heating, without liquefaction. An interfacing material (not shown) composed of an electrically conductive material may be locally applied to the respective first and second plurality of semiconductor devices 60, 64 for interfacing and providing an electrical pathway with the respective first connector 62 and the respective second connector 66 in the sintering process. Alternatively, ribbon-bonding or wire-bonding may be used for attaching the respective first and second connectors 62, 66.

A method of forming the power inverter module 10 may include sintering the respective first plurality of semiconductor devices 60 and the second plurality of semiconductor devices 64 to the first conductive layer 14. The respective first and second connectors 62, 66 are then placed on the respective first plurality of semiconductor devices 60 and the respective second plurality of semiconductor devices 64 to the semiconductor device. A first side of the respective first connector 62 is sintered to the respective first plurality of semiconductor devices 60 in the first set of islands 52 (shown in FIG. 3) while the opposing side is sintered to the second set of islands 54. Similarly, a first side of the respective second connector 66 is sintered to the respective second plurality of semiconductor devices 64 in the second set of islands 54 (shown in FIG. 3) while the opposing side is simultaneously sintered to the second conductive layer 16. Alternatively, wire-bonding may be employed to become the respective first and second connectors 62, 66.

Figure 4:
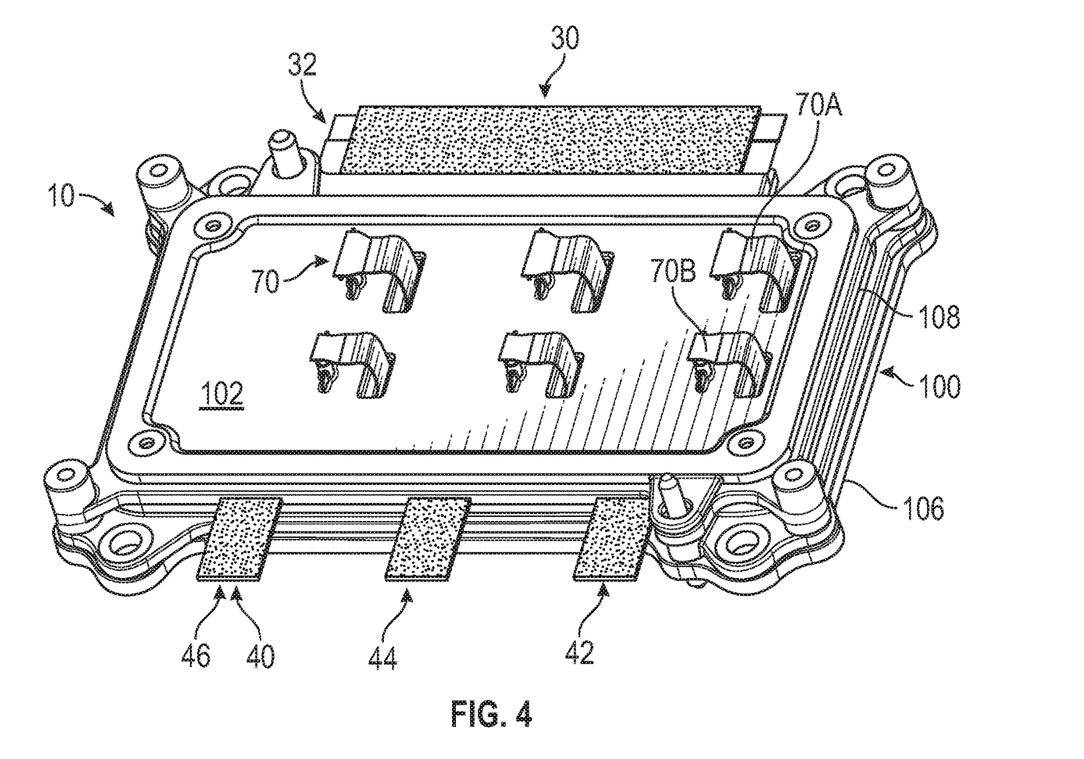
FIG. 4 is a schematic perspective view of the power inverter module of FIG. 1, encapsulated in a housing assembly.
Figure 6:
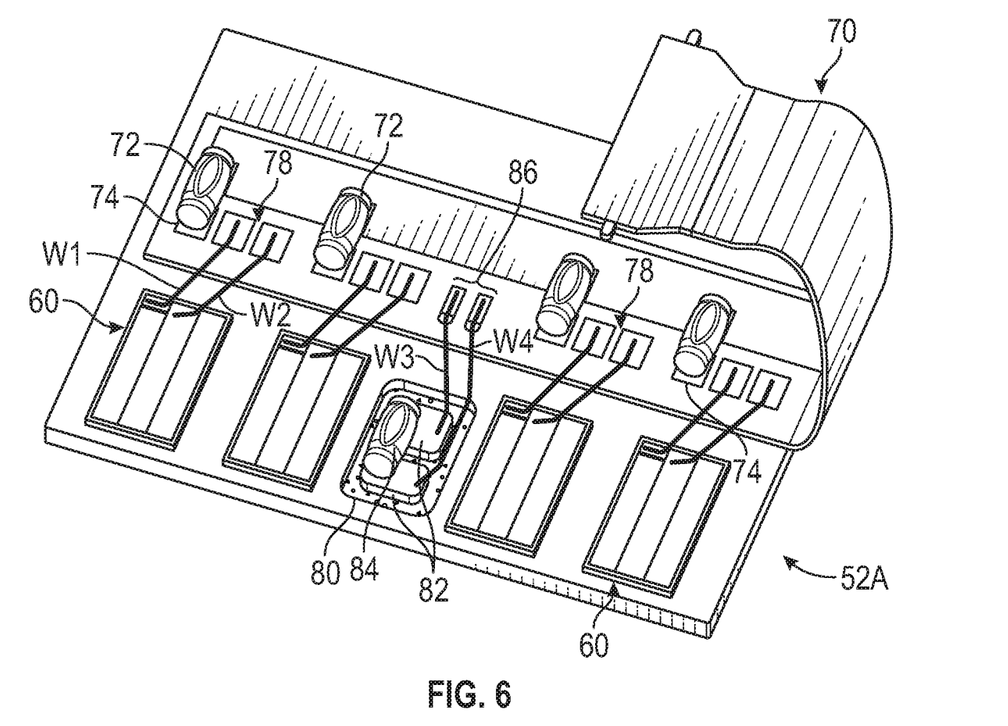
FIG. 6 is a schematic fragmentary view of one of the plurality of spaced-apart islands (referred to herein as example first island) shown in FIG. 1.

Referring to FIGS. 2 and 4, a respective flexible circuit 70 (such as first flexible circuit 70A and second flexible circuit 70B) may be positioned on each of the plurality of spaced-apart islands 50 (see FIG. 3) of the first conductive layer 14. FIG. 6 is a fragmentary view of one of the first set of islands 52, referred to herein as example first island 52A. The example first island 52A includes a respective flexible circuit 70, which is shown in greater detail in FIG. 7. The respective flexible circuit 70 may be affixed with conductive circuit patterns formed by etching metal foil cladding (such as copper) from polymer bases, plating metal, printing of conductive inks and other processes employed by those skilled in the art.

Referring to FIG. 6, a plurality of gate resistors 72 (also shown in FIG. 2) may be mounted on the respective flexible circuit 70. The plurality of gate resistors 72 control the turn-on and turn-off slew rate of the first plurality of semiconductor devices 60 and may be configured to provide equal current sharing among the first plurality of semiconductor devices 60. Positioning the plurality of gate resistors 72 directly on the respective flexible circuit 70 reduces the overall size of the control loop formed, reducing its inductance. The respective flexible circuit 70 is designed to provide a low inductance connection to a gate driver board (not shown) and the base module 12.

Referring to FIG. 6, the respective flexible circuit 70 may include a first plurality of contact pads 74 (also shown in FIG. 7) configured to respectively connect the plurality of gate resistors 72 to a respective gate layer 76. Referring to FIG. 6, the respective flexible circuit 70 may include a second plurality of contact pads 78 (also shown in FIG. 7) for connecting the respective first plurality of semiconductor devices 60, via wire bonds W1 and W2.

Referring to FIG. 3, each of the first set of islands 52 may define a respective cutout portion 80. As shown in FIG. 6, a respective thermistor 84 may be positioned in the respective cutout portion 80 through a respective conducting sections 82. The thermistor 84 may be composed of compounds of barium lead and strontium titanates or ceramic materials. The thermistor 84 defines a threshold temperature, with a sharply rising electrical resistance at temperatures above the threshold temperature and fairly constant low resistance at temperatures below the threshold. The thermistor 84 is configured to infer the temperature of the respective flexible circuit 70, respective first plurality of semiconductor devices 60 and/or surrounding components.

Figure 7:
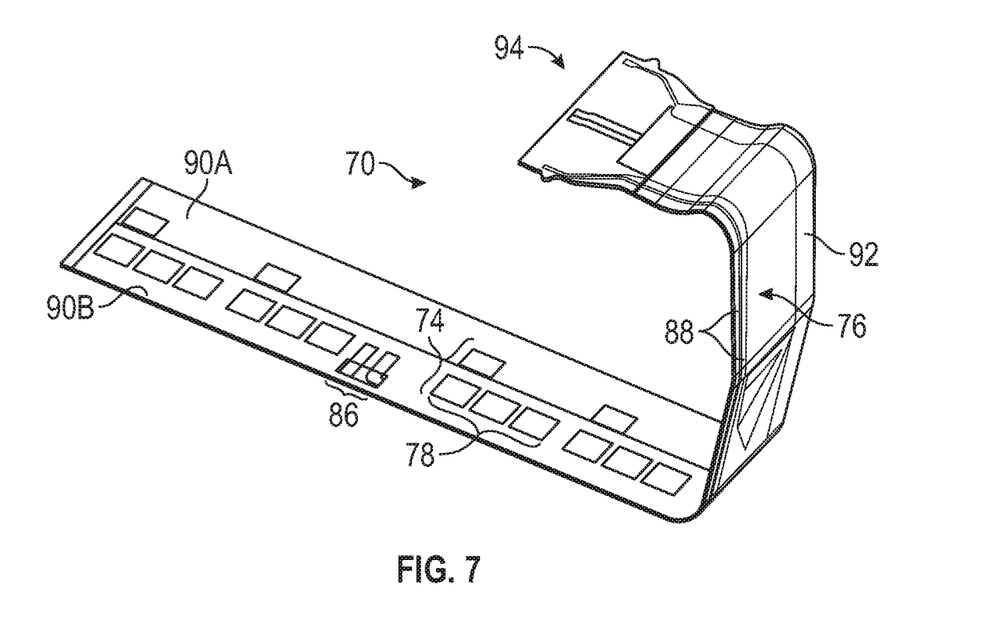
FIG. 7 is a schematic fragmentary perspective view of a respective flexible circuit employed in the example first island of FIG. 6.

Referring to FIG. 6, the respective flexible circuit 70 includes a third plurality of contact pads 86 (shown also in FIG. 7) configured to connect the respective thermistor 84 to a conductive track 88 in the respective flexible circuit 70, via wire bonds W3 and W4 attached to the respective conducting sections 82. Referring to FIG. 7, the flexible circuit 70 includes multiple conducting layers, such as drain layer 92, which provide respective connections to switch terminals. The multiple conducting layers are separated by several insulation layers 90A, 90B. An end section 94 carrying the end terminals of the conducting layers may be attached to a control board (not shown) or other component.

Figure 5:
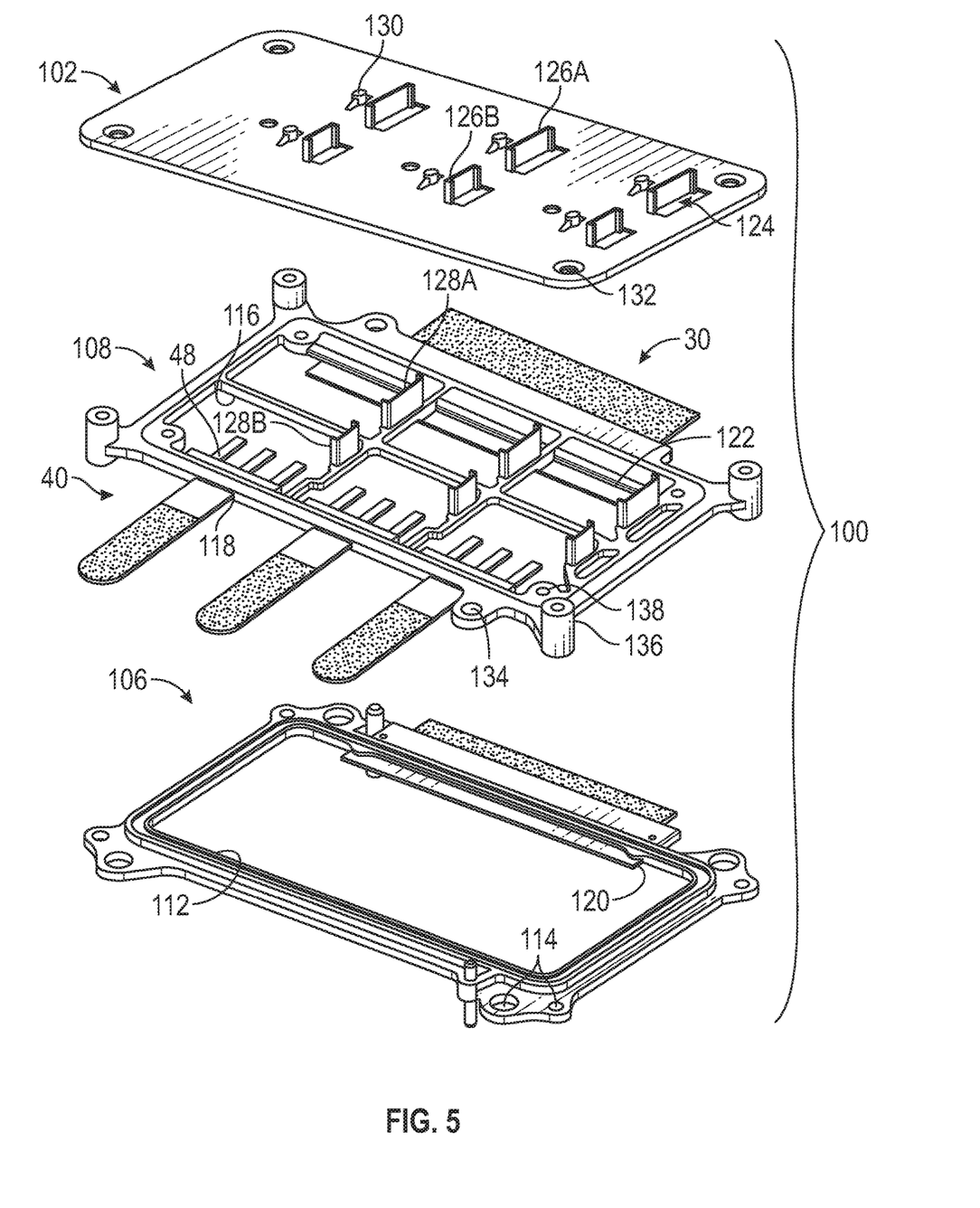
FIG. 5 is an exploded view of the housing assembly of FIG. 4.

Referring now to FIG. 4, a schematic perspective view of the power inverter module 10 encapsulated in a housing assembly 100 is shown. FIG. 5 is an exploded view of the housing assembly 100. Referring to FIGS. 4-5, the housing assembly 100 includes a lid 102 configured to at least partially cover a surface defined by the plurality of spaced-apart islands 50 of the first conductive layer 14. Referring to FIGS. 4-5, the housing assembly 100 includes a first frame 106 and a second frame 108 configured to encapsulate respective peripheral regions 110 (shown in FIG. 1) of the first conductive layer 14, the second conductive layer 16 and the third conductive layer 18. The first frame 106 and second frame 108 may be composed of a polymer-based or plastic material. The second frame 108 may be nested in the first frame 106.

Referring to FIG. 5, the first frame 106 includes a central opening 112 and a plurality of openings 114 located circumferentially relative to the central opening 112. Referring to FIG. 1, the third conductive layer 18 may include a plurality of slots, such as first slot 28A, second slot 28B and third slot 28C. The plurality of openings 114 of the first frame 106 are configured to align with the second slot 28B and third slot 28C of the third conductive layer 18. Referring to FIG. 5, the first frame 106 includes a terminal slot 120 corresponding to the second terminal 32, such that the second terminal 32 slides into the terminal slot 120.

Additionally, referring to FIG. 5, the second frame 108 includes respective apertures 116 configured to fit around each of the plurality of spaced-apart islands 50 (see FIG. 3). The second frame 108 includes respective side pockets 118 configured to fit the one or more output nodes 40. Referring to FIG. 5, the second frame 108 includes a terminal slot 122 sized corresponding to the first terminal 30, such that the first terminal 30 slides into the terminal slot 122. The lid 102 includes respective through holes 124 (see FIG. 5) configured to fit each of the respective flexible circuits 70 (see FIG. 4).

The housing assembly 100 is designed to compactly and effectively cover and protect the various components of the power inverter module 10. Referring to FIG. 5, the lid 102 may be formed with a first panel 126A and a second panel 126B, which may be in the form of a C-shaped channel for covering one side of the respective flexible circuit 70 (shown in FIG. 4). The second frame 108 may include a first wing 128A and a second wing 128B, that respectively mirror the first and second panel 126A, 126B (of the lid 102) and cover the opposing side of the respective flexible circuit 70 (shown in FIG. 4). The lid 102 may include support structures 130 for the respective flexible circuit 70.

The housing assembly 100 may be formed with multiple sets of aligned slots with threaded fasteners for securing the housing assembly 100. For example, referring to FIG. 5, holes 134, 136 in the second frame 108 align with plurality of slots 114 in the first frame 106. Referring to FIG. 5, holes 138 in the second frame 108 align with holes 132 in the lid 102.

Referring to FIG. 3, the first set of islands 52 may represent the high side switch and the second set of islands 54 may represent the low side switch. Referring to FIG. 2, the power inverter module 10 provides a high-side switching path extending from: the first terminal 30 (see arrow H1) through the first conductive layer 14 to the respective first plurality of semiconductor devices 60 (see arrow H2), then to the respective second plurality of semiconductor devices 64 (see arrow H3), via the first connector 62; then to the output node 40 (see arrow H4), via the second connector 66. Referring to FIG. 2, the power inverter module 10 provides a low-side switching path which extends from: the second terminal 32 (see arrow L1) through the second conductive layer 16 (see arrow L2); then to the first conductive layer 14 (via the second connector 66) and the output node 40 (see arrow L3).

Referring to FIG. 2, the power inverter module 10 provides a transition switching path extending: from the first terminal 30 (see arrow T1) to the respective first plurality of semiconductor devices 60 in the first conductive layer 14 (see arrow T2); then to the respective second plurality of semiconductor devices 64 (see arrow T3), via the first connector 62; then returning (via the second connector 66) along the second conductive layer 16 (see arrow T4); and back to the second terminal 32 (see arrow T5).

In summary, the power inverter module 10 has an overall configuration enabling significantly reduced parasitic inductances, allowing fast switching control of semiconductor devices such as wide-band gap devices. The power inverter module 10 enables reduced overall weight and size. Additionally, the configuration of the power inverter module 10 allows for efficient utilization and integration of the various components of the assembly.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or more desired characteristics from other embodiments, resulting in other embodiments not described in words or by reference to the drawings. Accordingly, such other embodiments fall within the framework of the scope of the appended claims.

What is claimed is:

1. A power inverter module comprising:
   a base module having a plurality of electrically conductive layers, including a first conductive layer, a second conductive layer and a third conductive layer, the base module defining a first end and a second end;
   a first terminal operatively connected to the first conductive layer at the first end and a second terminal operatively connected to the second conductive layer at the first end;
   an isolation sheet sandwiched between the first terminal and the second terminal;
   wherein the first terminal and the second terminal include a respective proximal portion composed of a first material and a respective distal portion composed of a second material;
   wherein at least one of the first terminal and the second terminal is bent to create an overlap zone such that a gap between the first terminal and the second terminal in the overlap zone is less than a threshold distance;
   wherein the first conductive layer is divided into a plurality of spaced-apart islands, including a first set of islands and a second set of islands;
   wherein the first set of islands extends between a center axis and the first end, the second set of islands extending between the center axis and the second end, and further comprising:
   a respective flexible circuit positioned on each of the plurality of spaced-apart islands.

2. The power inverter module of claim 1, wherein:
   the threshold distance is 1 mm.

3. The power inverter module of claim 1, wherein:
   the first conductive layer and the second conductive layer are at least partially composed of the first material; and
   the first terminal is laser-welded to the first conductive layer at the respective proximal portion and the second terminal is laser-welded to the second conductive layer at the respective proximal portion.

4. The power inverter module of claim 1, further comprising:
   a first insulation layer positioned between and configured to electrically isolate the first conductive layer and the second conductive layer; and
   a second insulation layer positioned between and configured to electrically isolate the second conductive layer and the third conductive layer.

5. The power inverter module of claim 1, further comprising: a respective first plurality of semiconductor devices positioned on each of the first set of islands; a respective first connector sintered to the respective first plurality of semiconductor devices and configured to connect the respective first plurality of semiconductor devices to the second set of islands; a respective second plurality of semiconductor devices positioned on each of the second set of islands; and a respective second connector sintered to the respective second plurality of semiconductor devices and configured to connect the respective second plurality of semiconductor devices to the second conductive layer.

6. The power inverter module of claim 1, further comprising:
   one or more output nodes operatively connected to the first conductive layer at the second end;
   wherein the one or more output nodes have a respective first portion composed of the first material and a respective second portion composed of the second material, the first conductive layer being at least partially composed of the first material; and
   wherein the one or more output nodes are laser-welded to the first conductive layer at the respective first portion.

7. The power inverter module of claim 6, wherein:
   the respective first portion of the one or more output nodes includes a respective plurality of fingers separated by respective gaps.

8. The power inverter module of claim 1, further comprising: a plurality of gate resistors mounted on the respective flexible circuit; a plurality of semiconductor devices mounted on each of the plurality of spaced-apart islands; wherein the respective flexible circuit includes a first plurality of contact pads configured to respectively connect the plurality of gate resistors to a respective gate layer of the respective flexible circuit; and wherein the respective flexible circuit includes a second plurality of contact pads configured to connect the plurality of semiconductor devices.

9. The power inverter module of claim 8, wherein:
   each of the first set of islands defines a respective cutout portion surrounding two respective conducting sections, and further comprising:
   a respective thermistor positioned in the respective cutout portion; and
   wherein the respective flexible circuit includes a third plurality of contact pads configured to connect the respective thermistor to a conductive track in the respective flexible circuit, via the two respective conducting sections.

10. The power inverter module of claim 1, further comprising:
    a housing assembly including a lid configured to at least partially cover a surface defined by the plurality of spaced-apart islands of the first conductive layer;
    wherein the housing assembly includes a first frame and a second frame configured to encapsulate respective peripheral regions of the first conductive layer, the second conductive layer and the third conductive layer; and
    wherein the second frame is nested in the first frame.

11. The power inverter module of claim 10, wherein:
    the first frame includes a central opening and a plurality of slots located circumferentially relative to the central opening;
    the second frame includes respective apertures configured to fit to the plurality of islands and respective side pockets configured to fit the one or more output nodes;
    the second frame includes a first terminal slot configured to fit the first terminal and the first frame includes a second terminal slot configured to fit the second terminal; and the lid includes respective through holes configured to fit the respective flexible circuit.

12. A method of forming a power inverter module, the method comprising:

layering a plurality of electrically conductive layers to form a base module, including a first conductive layer, a second conductive layer and a third conductive layer, the base module defining a first end and a second end;

connecting a first terminal to the first conductive layer at the first end and connecting a second terminal to the second conductive layer at the first end;

sandwiching an isolation sheet between the first terminal and the second terminal;

configuring the first terminal and the second terminal to include a respective proximal portion composed of a first material and a respective distal portion composed of a second material;

bending at least one of the first terminal and the second terminal to create an overlap zone such that a gap between the first terminal and the second terminal in the overlap zone is less than a threshold distance;

configuring the first conductive layer and the second conductive layer to be at least partially composed of the first material; and laser-welding the first terminal to the first conductive layer at the respective proximal portion and laser-welding the second terminal to the second conductive layer at the respective proximal portion.

13. The method of claim 12, further comprising:

dividing the first conductive layer into a plurality of spaced-apart islands, including a first set of islands and a second set of islands, such that the first set of islands extends between a center axis and the first end and the second set of islands extends between the center axis and the second end;

positioning a respective first plurality of semiconductor devices on each of the first set of islands;

positioning a respective second plurality of semiconductor devices on each of the second set of islands;

simultaneously, sintering a respective first connector to the respective first plurality of semiconductor devices and sintering a respective second connector to the respective second plurality of semiconductor devices;

sintering the respective first plurality of semiconductor devices to the second set of islands, via the respective first connector; and sintering the respective second plurality of semiconductor devices to the second conductive layer, via the respective second connector.

14. The method of claim 13, further comprising:

encapsulating the base module with a housing assembly having a lid, a first frame and a second frame, the second frame configured to nest in the first frame;

encapsulating respective peripheral regions of the first conductive layer, the second conductive layer and the third conductive layer with the first frame and the second frame;

covering a surface defined by the plurality of spaced-apart islands with the lid;

forming a central opening in the first frame and a plurality of slots circumferentially relative to the central opening;

forming respective apertures in the second frame configured to fit to the plurality of spaced-apart islands and respective side pockets configured to fit the one or more output nodes; and forming respective through holes in the lid, the respective through holes being sized to correspond to the respective flexible circuit.

15. The method of claim 12, further comprising:

connecting one or more output nodes to the first conductive layer at the second end;

configuring the one or more output nodes with a respective first portion composed of the first material and a respective second portion composed of the second material;

configuring the first conductive layer to be at least partially composed of the first material; and laser-welding the one or more output nodes to the first conductive layer at the respective first portion.

16. The method of claim 15, further comprising:

positioning a respective flexible circuit on each of the plurality of spaced-apart islands and placing a plurality of gate resistors on the respective flexible circuit;

positioning a first plurality of contact pads on the respective flexible circuit to connect the plurality of gate resistors to a gate layer of the respective flexible circuit; and positioning a second plurality of contact pads on the respective flexible circuit to connect the plurality of semiconductor devices.

17. The method of claim 16, further comprising:

forming a respective cutout portion in each of the first set of islands such that each of the respective cutout portion surrounds two respective conducting sections;

positioning a respective thermistor in the respective cutout portion; and positioning a third plurality of contact pads to connect the respective thermistor to a conductive track in the respective flexible circuit, via the two respective conducting sections.

18. A power inverter module comprising:

a base module having a plurality of electrically conductive layers, including a first conductive layer, a second conductive layer and a third conductive layer, the base module defining a first end and a second end;

a first terminal operatively connected to the first conductive layer at the first end and a second terminal operatively connected to the second conductive layer at the first end;

an isolation sheet sandwiched between the first terminal and the second terminal;

one or more output nodes operatively connected to the first conductive layer at the second end;

wherein the one or more output nodes have a respective first portion composed of the first material and a respective second portion composed of the second material, the first conductive layer being at least partially composed of the first material;

wherein the one or more output nodes are laser-welded to the first conductive layer at the respective first portion;

wherein the first terminal and the second terminal include a respective proximal portion composed of a first material and a respective distal portion composed of a second material; and wherein at least one of the first terminal and the second terminal is bent to create an overlap zone such that a gap between the first terminal and the second terminal in the overlap zone is less than a threshold distance.

19. The power inverter module of claim 18, further comprising:

a first insulation layer positioned between and configured to electrically isolate the first conductive layer and the second conductive layer; and a second insulation layer positioned between and configured to electrically isolate the second conductive layer and the third conductive layer.

\* \* \* \* \*